United States Patent
Dubrova et al.

(10) Patent No.: US 9,952,278 B2
(45) Date of Patent: Apr. 24, 2018

(54) REMOTE TEST MANAGEMENT OF DIGITAL LOGIC CIRCUITS

(71) Applicant: Telefonaktiebolaget LM Ericsson (publ), Stockholm (SE)

(72) Inventors: Elena Dubrova, Sollentuna (SE); Gunnar Carlsson, Älvsjö (SE); John Fornehed, Sollentuna (SE); Mats Näslund, Bromma (SE); Bernard Smeets, Dalby (SE)

(73) Assignee: Telefonaktiebolaget LM Ericsson (publ) (SE)

( * ) Notice: Subject to any disclaimer, the term of this patent is extended or adjusted under 35 U.S.C. 154(b) by 18 days.

(21) Appl. No.: 15/114,472

(22) PCT Filed: Feb. 5, 2014

(86) PCT No.: PCT/SE2014/050145
§ 371 (c)(1),
(2) Date: Jul. 27, 2016

(87) PCT Pub. No.: WO2015/119540
PCT Pub. Date: Aug. 13, 2015

(65) Prior Publication Data
US 2016/0349314 A1    Dec. 1, 2016

(51) Int. Cl.
*G01R 31/28* (2006.01)
*G01R 31/3181* (2006.01)
*G01R 31/3183* (2006.01)

(52) U.S. Cl.
CPC ... *G01R 31/2884* (2013.01); *G01R 31/31813* (2013.01); *G01R 31/318335* (2013.01); *G01R 31/318385* (2013.01)

(58) Field of Classification Search
CPC ...... G01R 31/31813; G01R 31/318335; G01R 31/318385
See application file for complete search history.

(56) References Cited

U.S. PATENT DOCUMENTS 6,453,014 B1 * 9/2002 Jacobson ............... H04L 1/24
379/26.01
2005/0193294 A1   9/2005 Hildebrant
(Continued)

OTHER PUBLICATIONS

McCluskey, Edward J., "Built-In Self-Test Techniques", IEEE Design and Test of Computers, Issue. 2, vol. 2, Apr. 1985, 21-28.
(Continued)

*Primary Examiner* — Jermele M Hollington
*Assistant Examiner* — Alvaro Fortich
(74) *Attorney, Agent, or Firm* — Murphy, Bilak & Homiller, PLLC

(57) ABSTRACT

Electronic devices (320) are provided which comprise a digital logic circuit (101) and a test module (322) adapted to receive test parameters from a remote test management device (310), generate test patterns based on the test parameters, apply the test patterns to the digital logic circuit, receive test responses from the digital logic circuit, compact the test responses into a test signature, and either transmit the test signature to the remote test management device or determine a test result based on a comparison of an expected signature received from the remote test management device with the test signature. Further provided are remote test management devices comprising means adapted to acquire test parameters suitable for generating test patterns for a digital logic circuit, acquire an expected signature corresponding to the test patterns, transmit the test parameters to at least one electronic device comprising the digital logic circuit, and either receive a test signature from the at least one electronic device and determine a test result based on a comparison of the expected signature with the test signature, or transmit the expected signature to the at least one electronic device.

50 Claims, 5 Drawing Sheets

(56) References Cited

U.S. PATENT DOCUMENTS

| | | |
|---|---|---|
| 2006/0156144 A1 | 7/2006 | Cheng et al. |
| 2010/0017668 A1* | 1/2010 | Pichamuthu ... G01R 31/318385 714/738 |
| 2012/0126781 A1* | 5/2012 | Narayanan ......... G01R 31/3004 324/76.11 |

OTHER PUBLICATIONS

Becker, Georg T. et al., "Stealthy Dopant-Level Hardware Trojans", Cryptographic Hardware and Embedded Systems—CHES 2013, vol. 8086, Springer Berlin Heidelberg, 2013, 197-214.

* cited by examiner

REMOTE TEST MANAGEMENT OF DIGITAL LOGIC CIRCUITS

TECHNICAL FIELD

The invention relates to electronic devices comprising a digital logic circuit and a test module for testing the digital logic circuit, remote test management devices for remotely testing the digital logical circuits comprised in the electronic devices, corresponding methods, corresponding computer programs, and corresponding computer program products.

BACKGROUND

A hardware fault in a digital logic circuit may negatively affect its function. In particular, this applies to digital logic circuits providing cryptographic functionality, since secure operation may be jeopardized by hardware faults. Therefore, it is desirable that digital logic circuits perform Built-In Self-Tests (BIST) during their life-time. Integrated circuits (IC) with BIST functionality typically incorporate on-chip logic for test generation and test response analysis.

Logic BIST (LBIST), which is used for testing digital logic circuits, typically employs a Pseudo-Random Pattern Generator (PRPG) for generating test patterns which are applied to the circuit-under-test (CUT), and a Multiple Input Signature Register (MISR) for obtaining a compacted response, the so-called signature, of the CUT to these test patterns. An incorrect MISR output indicates a fault in the CUT.

LBIST is typically used in a combination with scan design, which is a design-for-test technique providing a simple way of setting and observing each cell, or storage element, in a digital logic circuit. In scan design, all storage elements of the digital logic circuit are connected into one or more shift registers, called scan chains, by multiplexing their respective inputs to support a scan mode which allows serial loading and unloading of a scan chain's content. For each scan chain, a test pattern is loaded into the chain of storage elements, and the state of every storage element is read out. In normal operational mode, the scan chains do not affect operation of the circuit.

LBIST is commonly managed and controlled by a control unit which either resides on the CUT or on the same circuit board as the CUT. The control unit initiates LBIST by providing test parameters to the PRPG, such as an initialization value and number of test patterns to be generated, based on which the PRPG generates the test patterns which subsequently are applied to the CUT. Then, the test responses received from the CUT are compacted by the MISR into a signature which is compared to an expected signature in order to determine a test result. The test parameters and the expected signature are stored in a memory or hard-wired. Typically, LBIST is performed automatically at power-up and restart, or in response to an external trigger, e.g., if a hardware or software supervising the chip indicates a fault. In addition, LBIST may be initiated by an operator, e.g., for debugging purposes when a faulty chip is sent for repair.

In known LBIST, the same set of test patterns is used every time a test is performed. This is due to the fact that the PRPG always starts from the same initial state, which is determined by the initialization value provided during manufacturing, and accordingly generates the same set of test patterns. Furthermore, the test signature which is obtained by accumulating and compacting the test responses is compared to the same expected signature which is stored or hard-wired in the chip and provided during manufacturing. This opens a door for hardware Trojans, i.e., malicious modifications of circuit elements during the manufacturing process, which do not change the signature created by the MISR. This is possible because the test responses of the CUT are accumulated and compacted into a signature, and the probability that a faulty circuit produces the same signature as the correct circuit is non-zero. The latter is often referred to as "aliasing error". The feasibility of such an attack was recently demonstrated for Intel's hardware random number generator used in the Ivy Bridge processor, which was considered to be cryptographically secure and which was protected by traditional LBIST (G. T. Becker, F. Regazzoni, C. Paar, and W. P. Burleson, "Stealthy Dopant-Level Hardware Trojans", in "Cryptographic Hardware and Embedded Systems—CHES 2013", Lecture Notes in Computer Science, Volume 8086, Springer Berlin Heidelberg, 2013, pages 197-214).

SUMMARY

It is an object of the invention to provide an improved alternative to the above techniques and prior art.

More specifically, it is an object of the invention to provide improved logic built-in testing of electronic devices comprising a digital logic circuit, and in particular logic built-in testing capable of detecting malicious modifications of circuit elements of the digital logic circuit. Further objects of the invention are to provide improved test coverage and to enable remote testing of a potentially large amount of electronic devices having similar digital logic circuits.

These and other objects of the invention are achieved by means of different aspects of the invention, as defined by the independent claims. Embodiments of the invention are characterized by the dependent claims.

According to a first aspect of the invention, an electronic device is provided. The electronic device comprises a digital logic circuit and a test module. The test module is adapted to receive one or more test parameters from a remote test management device and to generate one or more test patterns based on the test parameters. The test module is further adapted to apply the test patterns to the digital logic circuit, receive one or more test responses from the digital logic circuit, compact the test responses into a test signature, and transmit the test signature to the remote test management device.

According to a second aspect of the invention, an electronic device is provided. The electronic device comprises a digital logic circuit and a test module. The test module is adapted to receive one or more test parameters from a remote test management device and to generate one or more test patterns based on the test parameters. The test module is further adapted to apply the test patterns to the digital logic circuit, receive one or more test responses from the digital logic circuit, compact the test responses into a test signature, receive an expected signature corresponding to the test patterns from the remote test management device, and determine a test result. The test result is determined based on a comparison of the expected signature with the test signature.

According to a third aspect of the invention, a remote test management device is provided. The remote test management device comprises means adapted to acquire one or more test parameters which are suitable for generating one or more test patterns for a digital logic circuit. The means are further adapted to acquire an expected signature corresponding to the test patterns, and transmit the test parameters to at least one electronic device comprising the digital logic circuit. The means are further adapted to receive a test signature from the at least one electronic device, and determine a test result based on a comparison of the expected signature with the test signature.

According to a fourth aspect of the invention, a remote test management device is provided. The remote test management device comprises means adapted to acquire one or more test parameters which are suitable for generating one or more test patterns for a digital logic circuit. The means are further adapted to acquire an expected signature corresponding to the test patterns, transmit the test parameters to at least one electronic device comprising the digital logic circuit, and transmit the expected signature to the at least one electronic device.

According to a fifth aspect of the invention, a method of testing a digital logic circuit comprised in an electronic device is provided. The method is performed by the electronic device. The method comprises receiving one or more test parameters from a remote test management device and generating one or more test patterns based on the test parameters. The method further comprises applying the test patterns to the digital logic circuit, receiving one or more test responses from the digital logic circuit, compacting the test responses into a test signature, and transmitting the test signature to the remote test management device.

According to a sixth aspect of the invention, a method of testing a digital logic circuit comprised in an electronic device is provided. The method is performed by the electronic device. The method comprises receiving one or more test parameters from a remote test management device and generating one or more test patterns based on the test parameters. The method further comprises applying the test patterns to the digital logic circuit, receiving one or more test responses from the digital logic circuit, compacting the test responses into a test signature, receiving an expected signature corresponding to the test patterns from the remote test management device, and determining a test result based on a comparison of the expected signature with the test signature.

According to a seventh aspect of the invention, a method of testing a digital logic circuit comprised in an electronic device is provided. The method is performed by a remote test management device. The method comprises acquiring one or more test parameters which are suitable for generating one or more test patterns for a digital logic circuit. The method further comprises acquiring an expected signature corresponding to the test patterns and transmitting the test parameters to at least one electronic device comprising the digital logic circuit. The method further comprises receiving a test signature from the at least one electronic device, and determining a test result based on a comparison of the expected signature with the test signature.

According to an eighth aspect of the invention, a method of testing a digital logic circuit comprised in an electronic device is provided. The method is performed by a remote test management device. The method comprises acquiring one or more test parameters which are suitable for generating one or more test patterns for a digital logic circuit. The method further comprises acquiring an expected signature corresponding to the test patterns, transmitting the test parameters to at least one electronic device comprising the digital logic circuit, and transmitting the expected signature to the at least one electronic device.

According to further aspects of the invention, computer programs comprising computer-executable instructions are provided. The computer-executable instructions cause a device, when executed on a processing unit comprised in the device, to perform the method according to any one of the first, second, third, or fourth, aspect of the invention described hereinabove.

According to even further aspects of the invention, computer program products comprising a computer-readable storage media are provided. The computer-readable storage media have the computer programs according to the corresponding aspects of the invention embodied therein.

In the present context, an electronic device in accordance with an embodiment of the invention comprises a digital logic circuit implementing at least part of the functionality which the electronic device provides. For instance, the digital logic circuit may implement cryptographic functionality, such as a pseudo-random number generator or a stream cipher. The electronic device is provided with a test module for the purpose of testing the digital logic circuit and may further comprise other types of circuitry than digital logic, which other types of circuitry are not tested by embodiments of the invention. The test module may be integrated with the digital logic circuit, e.g., into a single IC, or provided together with the digital logic circuit, e.g., on a common circuit board. The electronic device may be comprised in a cryptographic device, e.g., a cryptographic circuitry. The electronic device may also be comprised in a mobile terminal, such as a User Equipment (UE), a mobile phone, a smartphone, a smart card, a tablet, or a Machine-to-Machine (M2M) or Internet-of-Things (IoT) type of device.

The invention makes use of an understanding that traditional LBIST, which utilizes the same set of test patterns for testing a digital logic circuit, the CUT, and the same expected signature every time testing is performed, renders the supervised CUT vulnerable for hardware Trojans exploiting the aliasing error of the MISR. This is due to the fact that malicious modifications of circuit elements may be performed during the manufacturing process which do not change the signature created by the MISR when compacting test responses of the modified circuit, since the signature represents the cumulative response of the CUT to the entire set of test patterns.

Embodiments of the invention mitigate this problem by providing an electronic device and a remote test management device which are adapted to conduct logic tests cooperatively. More specifically, this is achieved by transmitting test parameters from the remote test management device to the electronic device and generating test patterns based on the test parameters received from the remote test management device. In addition to providing the test parameters, the remote test management device also provides an expected signature corresponding to the set of test patterns generated by the electronic device for detecting hardware faults in the digital logic circuit, including malicious modifications of the digital logic circuit. This is achieved by comparing the test signature, obtained by compacting the test responses from the digital logic circuit, with the expected signature. The comparison of the test signature with the expected signature is either performed at the remote test management device or at the electronic device. If performed at the remote test management device, the test signature is transmitted from the electronic device to the remote test management device for subsequent comparison with the expected signature. If performed at the electronic device, the expected signature is transmitted from the remote test management device to the electronic device for subsequent comparison with the test signature.

Embodiments of the invention are advantageous over traditional LBIST in that different sets of test patterns may be used every time testing is conducted, thereby improving test coverage. In particular, by using different initialization values, the PRPG generates test patterns starting from a different initial state, resulting in different sequences of test patterns. This is advantageous in that the provision of hardware Trojans during manufacturing is hampered, for the reason that an adversary does not have complete knowledge of the test patterns which will be generated during the lifetime of the digital logic circuit, the CUT.

It is important to note that the generation of expected signatures is computationally very demanding, since it is based on a simulation of the digital logic circuit to be tested, i.e., a design of the digital logic circuit. Therefore, it is not feasible to generate expected signatures at the electronic device, since such an approach would considerably increase the complexity of the electronic device as well as its chip area and power consumption. It is neither feasible to store a large amount of pre-generated expected signatures, resulting in a considerable increase in storage requirements. These aspects are of utmost importance for built-in testing of mobile terminals, and in particular for M2M/IoT devices which are characterized by limited computing resources and commonly are battery powered.

Embodiments of the invention provide logic testing of digital logic circuits with improved protection against hardware Trojans as well as improved test coverage. In addition to that, the remote testing approach disclosed herein is advantageous in M2M/IoT scenarios since it enables efficient remote test management and detection of faults in a potentially large number of devices. This applies in particular to one-to-many testing of a large number of similar devices, or a large number of devices comprising similar digital logic circuits.

According to an embodiment of the invention, the test result is determined as indicating a fault in the digital logic circuit if the expected signature differs from the test signature. In other words, if the test signature obtained by compacting the accumulated test responses received from the digital logic circuit differs from the expected signature, a fault is indicated. That is, the test has failed. Otherwise, the test result is determined as indicating that the test as passed.

According to an embodiment of the invention, information pertaining to the test result is transmitted from the electronic device to the remote test management device. This applies to embodiments of the invention which perform comparison of the test signature with the expected signature in the electronic device. The transmitted information may comprise the test result, i.e., information indicating whether the test has failed or passed.

According to an embodiment of the invention, the test module is further adapted to perform logic self-tests on the digital logic circuit. Such tests, may, e.g., be performed at power-up or restart, or in response to an external trigger. To this end, the test module generates one or more test patterns based on stored or hard-wired test parameters, applies the test patterns to the digital logic circuit, compacts test outputs received from the digital logic circuit into a test signature, and compares the test signature to a stored or hard-wired expected signature.

According to an embodiment of the invention, the means of the remote test management device are further adapted to acquire the expected signatures by computing the expected signatures based on the test parameters and a design of the digital logic circuit. As discussed before, computing expected signatures by means of simulating the digital logic circuit is computationally very demanding and is therefore not feasible to be performed at the electronic device. As an alternative, pre-generated expected signatures may be stored, e.g., in a database, at the remote test management device or at an external storage accessible by the remote test management device.

Even though advantages of the invention have in some cases been described with reference to embodiments of a certain aspect of the invention, corresponding reasoning applies to embodiments of other aspects of the invention.

Further objectives of, features of, and advantages with, the invention will become apparent when studying the following detailed disclosure, the drawings and the appended claims. Those skilled in the art realize that different features of the invention can be combined to create embodiments other than those described in the following.

BRIEF DESCRIPTION OF THE DRAWINGS

The above, as well as additional objects, features and advantages of the invention, will be better understood through the following illustrative and non-limiting detailed description of embodiments of the invention, with reference to the appended drawings, in which.

All the figures are schematic, not necessarily to scale, and generally only show parts which are necessary in order to elucidate the invention, wherein other parts may be omitted or merely suggested.

DETAILED DESCRIPTION

The invention will now be described more fully herein after with reference to the accompanying drawings, in which certain embodiments of the invention are shown. This invention may, however, be embodied in many different forms and should not be construed as limited to the embodiments set forth herein. Rather, these embodiments are provided by way of example so that this disclosure will be thorough and complete, and will fully convey the scope of the invention to those skilled in the art.

Figure 1:
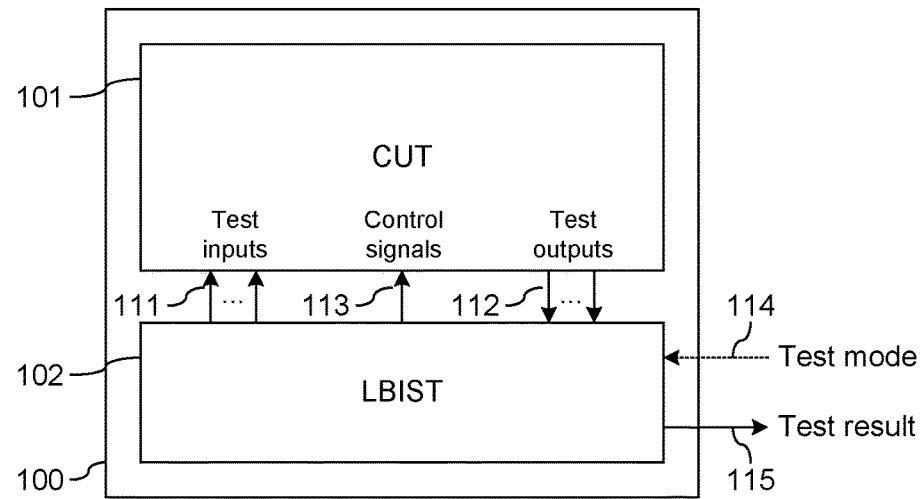
FIG. 1 shows a block diagram of a known IC with LBIST functionality.

In FIG. 1 an IC 100 is illustrated as an example for an electronic device with conventional LBIST functionality. IC 100 may, e.g., be a microprocessor, an Application-Specific IC (ASIC), or a Field-Programmable Gate Array (FPGA). It may also be part of a larger IC, a System-on-Chip (SoC), i.e., an IC which integrates all components of an electronic system into a single chip, a System-in-Package (SiP), which is a number of integrated circuits enclosed in a single module or package, or a System-on-Module (SoM), which is a complete embedded computer built on a single circuit board. IC 100 comprises a digital logic circuit 101, the CUT, which implements at least part of the functionality which IC 100 provides, and an LBIST module 102 for performing logic tests on CUT 101.

Figure 2:
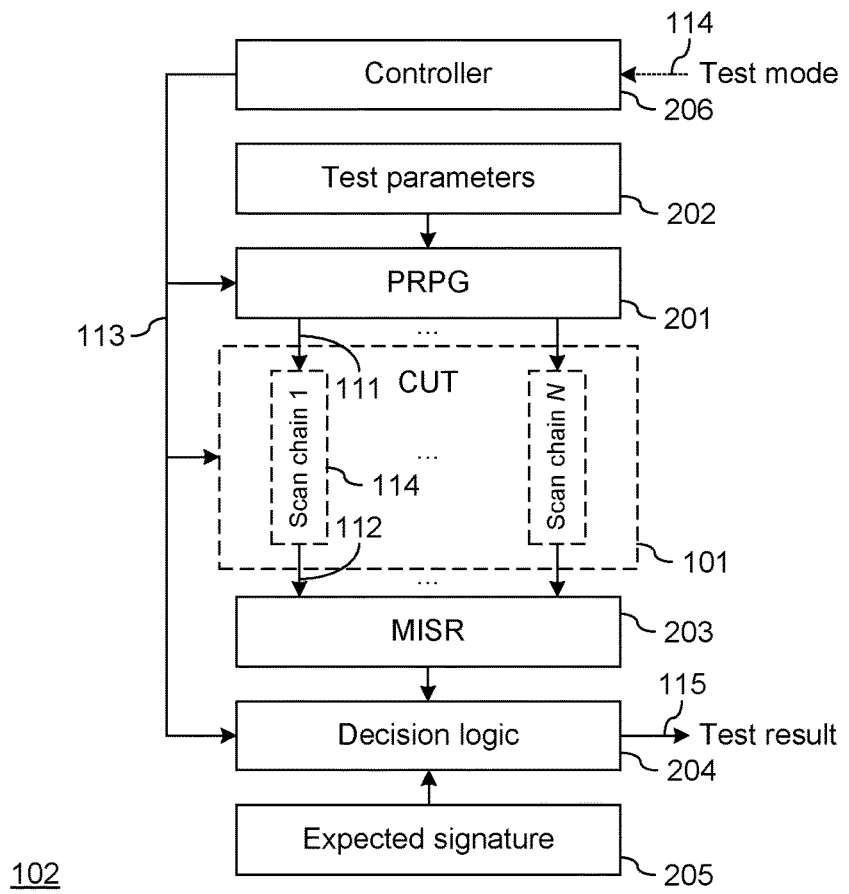
FIG. 2 shows a functional block diagram of a known LBIST module.

LBIST module 102, which is illustrated in more detail in FIG. 2, comprises a PRPG 201, which may be based on a Linear Feedback Shift Register (LFSR), for generating pseudo-random test patterns which during testing are applied to CUT 101 via test inputs 111. A test pattern comprises a plurality of binary values, one for each test input 111. The test patterns are generated based on one or more test parameters which are stored 202 or hard-wired 202 in LBIST module 102. Typically, the test parameters comprise an initialization value, defining an initial state of PRPG 201, and a number of test patterns to be generated. LBIST module 102 further comprises an MISR 203 for compacting test responses received from CUT 101 via test outputs 112, commonly referred to as "stump data", into a test signature, and a decision logic 204 for comparing the test signature obtained from MISR 203 to an expected signature which is stored 205 or hard-wired 205 in LBIST module 102. The result of this comparison is made available by means of a signal 115 indicating the test result to an external circuit, e.g., a fault supervision unit provided together with IC 100. LBIST module 102 further comprises a controller 206 for controlling the operation of LBIST module 102 and CUT 101 by means of one or more control signals 113. Controller 206 typically performs sequences of logic tests autonomously, e.g., at a power-up or at restart, in response to a detected fault condition, or in response to an external trigger received via an optional control input 114. Control input 114 may also be used for toggling IC 100 between a normal mode of operation and a test mode, or for initiating a test cycle, and may, e.g., be connected to a fault supervision unit provided together with IC 100.

LBIST is typically used in a combination with scan design, which is a design-for-test technique providing a simple way of setting and observing each cell, or storage element, in a digital logic circuit such as CUT 101. In scan design, the cells of a digital logic circuit, such as CUT 101, are connected into one or more shift registers, called scan chains 114. Scan chains 114 are provided with test inputs 111 which are multiplexed (multiplexers are not shown in FIG. 2) to support a scan mode enabling serial loading and unloading of the scan chains' 114 contents via test inputs 111 and test outputs 112, respectively. The scan chains are defined during circuit design and are representative for testing operational performance of parts of the CUT. Typically, scan chains are positioned before and after, i.e., interposed with, parts of functional circuits of the CUT in such a way that for each functional part there is (i) a "preceding scan chain" providing inputs to the circuit components of that functional part, and (ii) a "following scan chain" receiving the outputs of the functional part.

A test cycle typically involves selecting scan mode and serially loading a test pattern into scan chains 114 via test inputs 111. When scan chains 114 are fully loaded, normal mode of operation of CUT 101 is selected, via control signals 113, and one clock cycle is applied, thereby applying the loaded test pattern to the inputs of the combinational logic implemented by CUT 101. The response of CUT 101 to the input values defined by the test patterns is made available at test outputs 112 of the combinational logic. Finally, scan mode of CUT 101 is selected again, and one cock cycle is applied to unload the output values of scan chains 114 through test outputs 112. While the outputs are shifted out of scan chains 114, the next test pattern can be loaded into scan chains 114. MISR 203 compacts and accumulates the test responses received via test outputs 112 into a test signature which subsequently is compared, by decision logic 204, to an expected signature stored 205 or hard-wired 205 in LBIST module 102. An incorrect MISR output, i.e., a signature which differs from an expected signature, i.e., a signature of a fault-free CUT 101, indicates a fault.

In traditional LBIST, as described hereinbefore with reference to FIGS. 1 and 2, the same set of test patterns is applied to CUT 101 every time logic tests are performed, i.e., every time a test cycle is executed. This is due to the fact that the test parameters, the initial state of PRPG 201 and a number of test patterns to be generated, as well as the corresponding expected signature, need to be stored or hard-wired in IC 100. The disadvantages of this approach of the prior art are twofold. Firstly, since the same set of test patterns is used every time logic tests are performed during the lifetime of IC 100, and the set of test patterns is known when the chip is manufactured, the chip is vulnerable for hardware Trojans exploiting the aliasing error of MISR 203. An adversary may exploit knowledge of the test patterns and the corresponding expected signature for maliciously modifying circuit elements during the manufacturing process, such that the test signature created by the MISR for the test of set vectors is identical to that of the original circuit design. Secondly, since the test patterns are generated in a pseudo-random fashion, a large number of test patterns are required to achieve satisfactory test coverage, typically of the order of 10,000 test patterns or more. The limitation in the size of the test set stems from the requirement that a test cycle is expected to be completed within a reasonable time, which depends on the application at hand. For instance, for a radio base station or other node of a radio access network, a test cycle for in-field testing is typically expected to complete within less than ten seconds. It is therefore not feasible to considerably increase the size of the test set, i.e., the set of test patterns, as this would result in a considerable increase in test cycle execution time. Using different test sets for each test cycle in order to improve test coverage is not feasible since each set of test patterns requires a corresponding expected signature for determining whether the chip has passed or not. Whereas generating the test patterns by the PRPG is computationally not very demanding, generating the corresponding expected signature constitutes a considerable computational effort, since it requires simulating the combinational logic implemented by the CUT in software, and to calculate the response of the simulated combinational logic to each test pattern. In other words, in addition to the CUT, the chip would require processing means sufficiently complex to simulate the combinational logic implemented by the CUT and to calculate output responses of the CUT to the test patterns as input. Obviously, this would result in a considerable increase in complexity of the chip. It will also be appreciated that it is not feasible to store pre-generated signatures for varying or large test sets, due to the corresponding increase in required storage resources.

In the following, and with reference to FIGS. 3 to 13, remote testing in accordance with embodiments of the invention is described.

Figure 3:
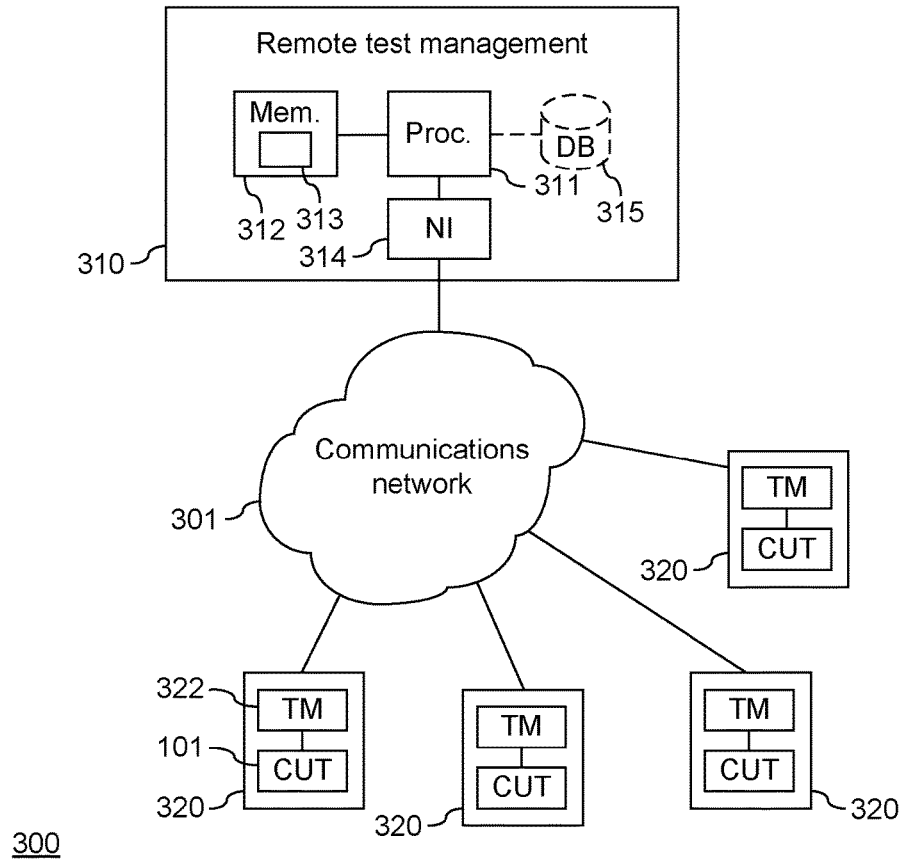
FIG. 3 schematically illustrates remote testing in accordance with an embodiment of the invention.

FIG. 3 illustrates a system 300 comprising a remote test management device 310 and one or more electronic devices 320 arranged for communicating with each other over a communications network 301. Remote test management device 310 may, e.g., be a personal computer which is provided with a computer program in accordance with an embodiment of the invention, or a dedicated fault supervision unit, as is described further below. Remote test management device 310 may also be implemented as a virtual machine for execution in a cloud computing environment.

Each of electronic devices 320 comprises a digital logic circuit, CUT 101, and a Test Module (TM) 322 for performing logic tests on CUT 101, as is described further below. It will be appreciated that, although electronic devices 320 are illustrated in FIG. 3 as directly communicating with remote test management device 310, electronic devices 320 may be comprised in mobile terminals, e.g., UEs, computers, tablets, M2M devices, and so forth, through which communication which remote test management device 310 is performed. Communications network 301 may, e.g., be any one, or a combination of, a Local Area Network (LAN), a Wireless LAN (WLAN), a Wire Area Network (WAN), the Internet, a corporate network, a cellular radio network such as Global System for Mobile Communications (GSM), Universal Mobile Telecommunications System (UMTS), or Long term Evolution (LTE), or an ad-hoc, mesh, or capillary network. The communication between remote test management device 310 and electronic devices 320 may be effected by means of any suitable communication protocol known in the art, e.g., Transmission Control Protocol (TCP), User Datagram Protocol (UDP), or any device management protocol such as TR.069 (Broadband Forum), Open Mobile Alliance (OMA) Device Management, or OMA Lightweight M2M.

Embodiments of the invention perform logic testing of CUT 101 in a distributed fashion, rather than autonomously as in the prior art. To this end, remote test management device 310 acquires test parameters, based on which a set of test patterns can be generated using a PRPG, and an expected signature corresponding to the set of test patterns. The test parameters are transmitted, over communications network 301, to at least one of the electronic devices 320. Based on the received test parameters, electronic device 320 generates test patterns and conducts logic tests similar to conventional LBIST described with reference to FIGS. 1 and 2. That is, the generated test patterns are applied to CUT 101 and the test responses from CUT 101 are compacted into a test signature, which subsequently is compared to a corresponding expected signature in order to determine a test result, i.e., whether CUT 101 has passed or failed for the set of test patterns. The comparison may either be performed at remote test management device 310 or at electronic device 320. If the comparison is performed at remote test management device 310, the test signature is transmitted from electronic device 320 to remote test management device 310, where it is compared to an expected signature and a test result is determined accordingly. If the comparison is performed at electronic device 320, the expected signature is transmitted from remote test management device 310 to electronic device 320, where it is compared to the test signature and a test result is determined accordingly.

By proper selection of test parameters the problems associated with conventional LBIST are mitigated. In particular, by transmitting different initialization values defining the initial state of the PRPG, it is possible to perform logic tests using different test sets every time a test is performed, simply by using different initialization values, thereby improving detection of hardware Trojans. Further, the size of the test set can be increased, while keeping communication overhead low, by transmitting a test parameter to this effect, instructing electronic devices 320 to generate a test set of desired size. In this way, test coverage can be improved. To this end, the test parameters comprise at least one of an initialization value, a number of test patterns to be generated, and one or more sequence numbers of test patterns to be generated. By transmitting a list of one or more sequence numbers to electronic devices in accordance with an embodiment of the invention, in addition to an initialization value, specific test patterns can be selected and generated, owing to the deterministic character of sequences generated by PRPGs. Thereby, logic tests may be tailored for specific parts of the digital logic circuit.

Embodiments of the invention are advantageous in that the need for increased complexity of ICs supporting built-in logic testing with varying test sets, and/or test sets providing increased test coverage, is alleviated. By letting remote test management device 310, rather than electronic device 320, compute or store the expected signatures, the limitations in computing, storage, and battery resources, of electronic device 320 are overcome.

It will be appreciated that remote test management in accordance with embodiments of the invention may be performed in a one-to-one fashion, as described hereinbefore with reference to FIG. 3, or in a one-to-many fashion. In the latter case, test parameters are transmitted to several electronic devices 320 which either are identical or at least comprise identical CUTs 101, such that a common set of test patterns and a corresponding expected signature may be used. If comparison of the test signature with the expected signature is performed at remote test management device 310, each electronic device 320 transmits its test signature to remote test management device 310, where they are compared to the expected signature on a per-device basis. Correspondingly, if comparison is performed at electronic devices 320, the expected signature is transmitted to electronic devices 320. One-to-many testing has the additional advantage that an expected signature, the computation of which is computationally demanding, may be used for testing a potentially large number of identical electronic devices 320. This is of particular importance for M2M/IoT scenarios in which large amounts of small devices with limited computing, storage, and battery resources, are deployed. In the following, the invention is discussed in the context of one-to-one testing, i.e., remote test management device 310 remotely manages a single electronic device 320. However, embodiments are not limited to one-to-one testing and corresponding embodiments for one-to-many testing may easily be envisaged.

Further with reference to FIG. 3, an embodiment of remote test management device 310 is now described. Remote test management device 310 comprises processing means, such as a processing unit 311 and a memory 312 comprising a computer program 313, and a Network Interface (NI) 314, adapted to acquire one or more test parameters suitable for generating one or more test patterns for a digital logic circuit, CUT 101, comprised in one or more electronic devices 320, and to acquire an expected signature corresponding to the set of test patterns. The test parameters may, e.g., be provided by an operator of remote test management device 310 or retrieved from a database 315 which remote test management device 310 is provided with or has access to. The test parameters may be acquired when a test is initiated, e.g., requested by the operator, triggered by a fault indication received from one of electronic devices 320 or from a fault supervision unit, or based on a schedule. The means are further adapted to transmit the test parameters to electronic device 320 where they are used for generating test patterns, as is described further below. The test parameters are transmitted to electronic device 320 by network interface 314, via communications network 301. The means are further adapted to receive a test signature corresponding to the expected signature from electronic device 320, and to determine a test result based on a comparison of the expected signature with the received test signature. The test signature is received from electronic device 320 by network interface 314, via communications network 301. Optionally, the means are further adapted to determine the test result as indicating a fault in CUT 101 if the expected signature differs from the test signature received from electronic device 320.

Alternatively, the means comprised in remote test management device 310 may be adapted to transmit the expected signature to electronic device 320 and, optionally, to receive information pertaining to a test result for the test patterns from the electronic device 320, rather than receiving the test signature from electronic device 320 and determining the test result at remote test management device 310.

Optionally, the means comprised in remote test management device 310 may be adapted to encrypt the communication with electronic device 320, e.g., using Secure Shell (SSH), Secure Sockets Layer (SSL), Transport Layer Security (TSL), IPsec, or the like, as is known in the art. That is, the means are adapted to encrypt test parameters, and, optionally, the expected signature, which are transmitted to electronic device 320, and to decrypt the test signature or the test result which are received from electronic device 320. Additionally, remote test management device 310 may be adapted to authenticate the communication with electronic device 320, as is known in the art, thereby avoiding man-in-the middle and impersonation type of attacks.

Further optionally, the means are adapted to compute the expected signature based on a simulation of the circuit design of CUT 101, i.e., the underlying combinational logic, using the test patterns as input, as is known in the art. As an alternative, the expected signature may be stored in database 315 and retrieved when a test with a set of test patterns corresponding to the stored expected signature is performed.

Figure 4:
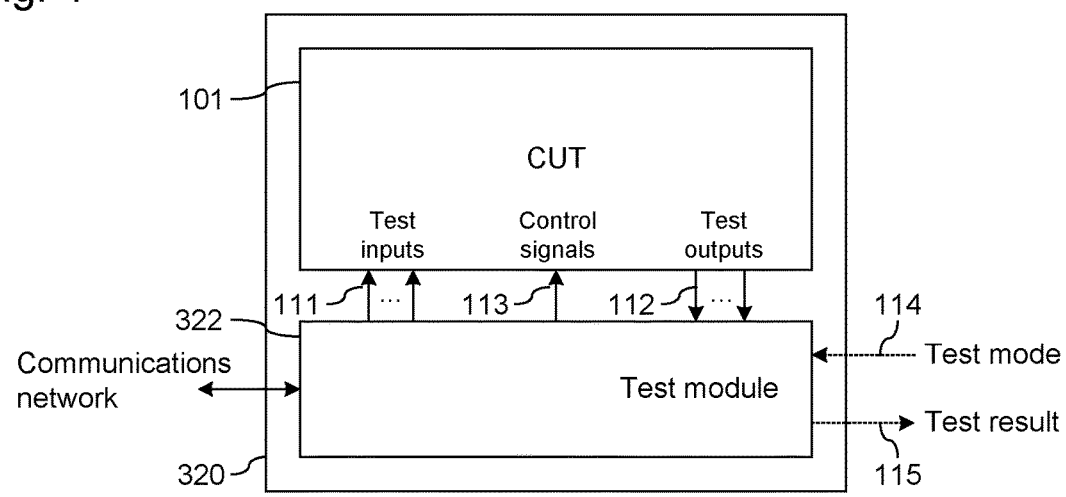
FIG. 4 shows an electronic device in accordance with an embodiment of the invention.
Figure 5:
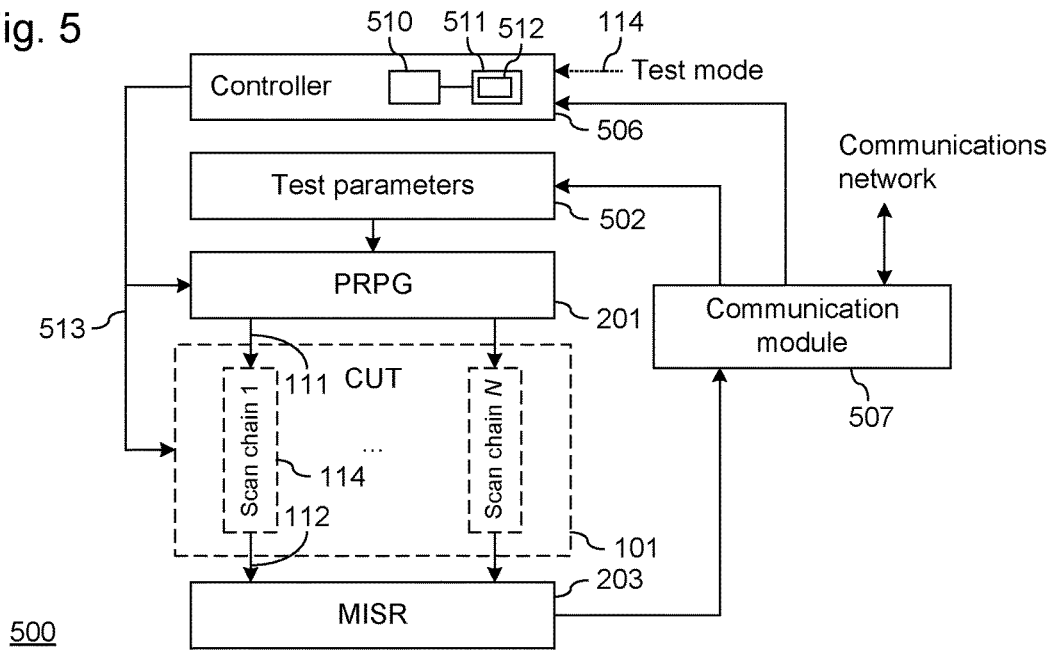
FIG. 5 shows a test module in accordance with an embodiment of the invention.
Figure 6:
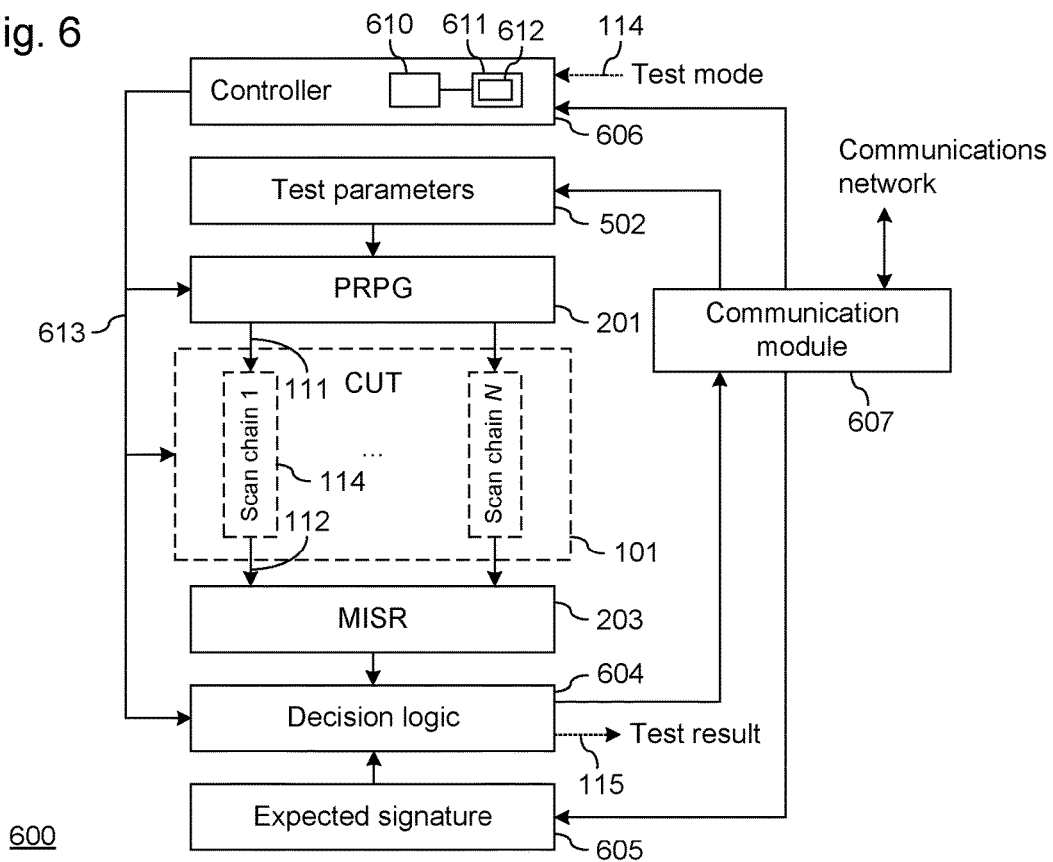
FIG. 6 shows a test module in accordance with another embodiment of the invention.

With reference to FIGS. 4 to 6, embodiments of electronic device 320 are now described. Similar to IC 100 described with reference to FIGS. 1 and 2, electronic device 320 comprises a digital logic circuit 101, the CUT, which implements at least part of the functionality which electronic device 320 provides, and a test module 322 for performing logic tests on CUT 101. Electronic device 320 may, e.g., be an IC 1100 illustrated in FIG. 11, comprising a digital logic circuit 1101 and a test module 1102, such as a microprocessor, an ASIC, or an FPGA. It may also be part of a larger IC, an SoC, an SiP 1200, or an SoM 1200, illustrated in FIG. 12, comprising a digital logic circuit 1201 and a test module 1202. An embodiment of electronic device 320 may, e.g., be comprised in a cryptographic circuitry such as a stream cipher or circuits for encryption and/or decryption. Even further, an embodiment of electronic device 320 may also be comprised in a mobile terminal such as mobile phone 1300, illustrated in FIG. 13, comprising a digital logic circuit 1301 and a test module 1302.

An embodiment 500 of test module 322 is illustrated in FIG. 5. Similar to LBIST module 102, test module 500 comprises a PRPG 201 for generating pseudo-random test patterns and an MISR 203 for compacting test responses received from CUT 101 via test outputs 112 into a test signature. In contrast to LBIST module 102, the test parameters are not stored or hard-wired but received from remote test management device 310. To this end, test module 500 comprises a communication module 507 configured to communicate with a remote test management device over a communications network, such as remote test management device 310 illustrated in FIG. 3. More specifically, communication module 507 is configured to receive test parameters and provide the received test parameters to PRPG 201, e.g., via a module 502 configured to temporarily store the test parameters. Communication module 507 is further configured to receive a test signature from MISR 203 and to transmit the test signature to the remote test management device.

Controller 506 of test module 500 comprises a processing means, such as a memory 511 storing a computer program 512, and a processing unit 510 executing computer program 512, whereby controller 506 is operative to control test module 500 to perform logic tests in response to receiving test parameters from the remote management device. More specifically, test module 500 is operative to receive one or more test parameters from a remote test management device, via communication module 507, generate one or more test patterns based on the received test parameters, using PRPG 201, apply the test patterns to CUT 101, receive test responses from CUT 101, compact the test responses into a test signature, using MISR 203, and transmit the test signature to the remote test management device, using communication module 507.

Optionally, controller 506 may further be configured to perform logic tests autonomously, e.g., at a power-up or at restart, in response to a fault condition, or in response to an external trigger received via an optional control input 114. Control input 114 may also be used for toggling electronic device 320 between a normal mode of operation and a test mode, or for initiating a test cycle, and may, e.g., be connected to a fault supervision unit provided together with electronic device 320.

An alternative embodiment 600 of test module 322 is now described with reference to FIG. 6. Similar to test module 500, test module 600 comprises a PRPG 201 for generating pseudo-random test patterns and an MISR 203 for compacting test responses received from CUT 101 via test outputs 112 into a test signature. Further, test module 600 also comprises a communication module 607 configured to communicate with a remote test management device over a communications network, such as remote test management device 310 illustrated in FIG. 3. Similar to communication module 507, communication module 607 is configured to receive test parameters and provide the received test parameters to PRPG 201, e.g., via a module 502 configured to temporarily store the test parameters.

Test module 600 further comprises a decision logic 604 configured to compare the test signature obtained from MISR 203 to an expected signature, as is known in the art. However, different from LBIST module 102, the expected signature is not stored or hard-wired in test module 600 but received from the remote management device, via communication module 607. To this end, communication module 607 is configured to receive the expected signature and provide the received expected signature to decision logic 604, e.g., via a module 605 configured to temporarily store the expected signature. Decision logic 604 may further be configured to provide the result of the comparison, i.e., a test result, to communication module 607 which may further be configured to transmit information pertaining to the test result to the remote management device. Further optionally, decision logic 604 may be configured to make available the test result to an external circuit, e.g., a fault supervision unit provided together with electronic device 320, by means of a signal 115.

Controller 606 of test module 600 comprises a processing means, such as a memory 611 storing a computer program 612, and a processing unit 610 executing computer program 612, whereby controller 606 is operative to control test module 600 to perform logic tests in response to receiving test parameters from the remote management device. More specifically, test module 600 is operative to receive one or more test parameters from a remote test management device, via communication module 607, generate one or more test patterns based on the received test parameters, using PRPG 201, apply the test patterns to CUT 101, receive test responses from CUT 101, compact the test responses into a test signature, using MISR 203, receive an expected signature corresponding to the set of test patterns from the remote test management device, via communication module 607, and determine a test result based on a comparison of the received expected signature with the test signature, using decision logic 604.

Optionally, controller 606 may further be configured to perform logic tests autonomously, e.g., at a power-up or at restart, in response to a fault condition, or in response to an external trigger received via an optional control input 114. Control input 114 may also be used for toggling electronic device 320 between a normal mode of operation and a test mode, or for initiating a test cycle, and may, e.g., be connected to a fault supervision unit provided together with electronic device 320.

Embodiments of test module 322, such as test modules 500 and 600, and in particular communication modules 507 and 607, may further be configured to encrypt the communication with the remote test management device, e.g., using SSH, SSL, TSL, IPsec, or the like, as is known in the art. That is, the test parameters and, optionally, the expected signature, received from the remote test management device are decrypted. Correspondingly, the test signature and the test result are encrypted before transmission to the remote test management device. Additionally, electronic device 320 may be adapted to authenticate the communication with remote test management device 310, as is known in the art, thereby avoiding man-in-the middle and impersonation type of attacks.

The communication between communication modules 507 and 607 and controllers 506 and 606, respectively, may be effected in accordance with the IEEE 1149.1 "Standard Test Access Port and Boundary-Scan Architecture", commonly named Joint Test Action Group (JTAG).

In the following, further embodiments of the invention are described with reference to FIGS. 7 to 10.

Figure 7:
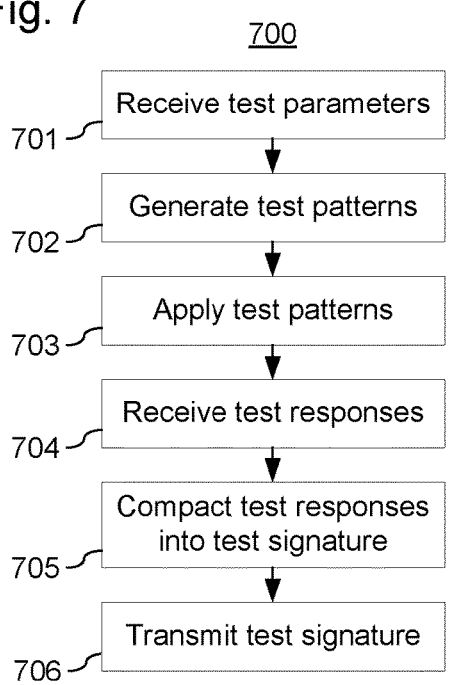
FIG. 7 shows a method of testing performed by the electronic device, in accordance with an embodiment of the invention.

In FIG. 7, an embodiment of a method 700 of testing a digital logic circuit comprised in an electronic device, such as CUT 101 comprised in electronic device 320, is illustrated. Method 700 is performed by the electronic device and comprises receiving 701 one or more test parameters from a remote test management device, such as remote test management device 310, and generating 702 one or more test patterns based on the received test parameters. Method 700 further comprises applying 703 the test pattern to the digital logic circuit, receiving 704 one or more test responses from the digital logic circuit, one for each test pattern, compacting 705 the test responses received from the digital logic circuit into a test signature, and transmitting 706 the test signature to the remote test management device. Method 700 may further comprise additional steps in accordance with what is described hereinbefore, in particular with reference to FIGS. 3 to 6.

Figure 8:
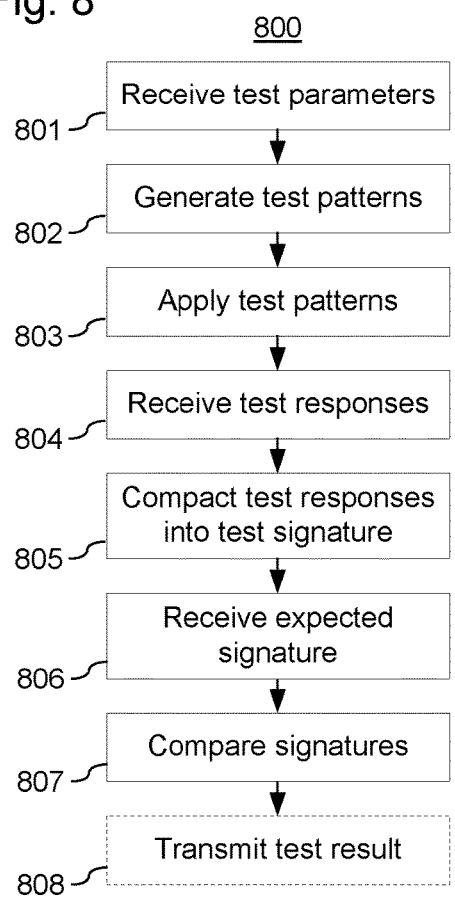
FIG. 8 shows a method of testing performed by the electronic device, in accordance with another embodiment of the invention.

In FIG. 8, an embodiment of another method 800 of testing a digital logic circuit comprised in an electronic device, such as CUT 101 comprised in electronic device 320, is illustrated. Method 800 is performed by the electronic device and comprises receiving 801 one or more test parameters from a remote test management device, such as remote test management device 310, and generating 802 one or more test patterns based on the received test parameters. Method 800 further comprises applying 803 the test patterns to the digital logic circuit, receiving 804 one or more test responses from the digital logic circuit, one for each test pattern, compacting 805 the test responses received from the digital logic circuit into a test signature, receiving 806 an expected signature corresponding to the test patterns from the remote test management device, and determining 807 a test result based on a comparison of the received expected signature with the test signature. Optionally, method 800 may further comprise transmitting 808 information pertaining to the test result to the remote test management device. Method 800 may further comprise additional steps in accordance with what is described hereinbefore, in particular with reference to FIGS. 3 to 6.

Embodiments of methods 700 or 800 may be implemented by a computer program 512 (or 612) comprising computer-executable instructions for causing a device, such as test module 500 (or 600) to perform accordingly, when the computer-executable instructions are executed on a processing unit 510 (or 610) comprised in the device. With reference to what is described hereinbefore, it will be appreciated that some or all of the steps of method 700 (or 800) are performed in cooperation with other functional parts of test module 500 (or 600). For instance, the step of receiving 701 one or more test parameters from a remote test management device is performed in cooperation with communication module 507, and the step of generating 702 one or more test patterns based on the received test parameters is performed in cooperation with PRPG 201.

Figure 9:
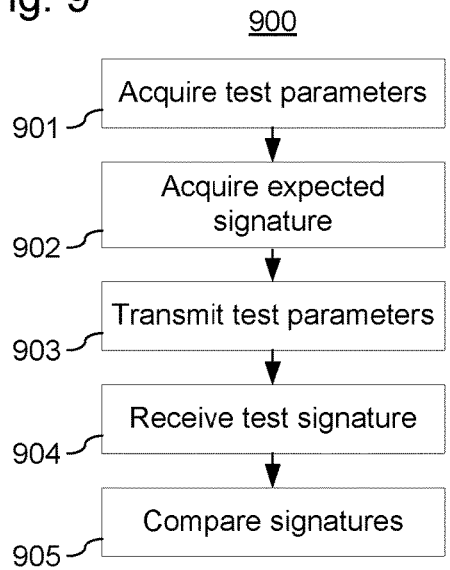
FIG. 9 shows a method of testing performed by the remote test management device, in accordance with an embodiment of the invention.

In FIG. 9, an embodiment of a method 900 of testing a digital logic circuit comprised in an electronic device, such as CUT 101 comprised in electronic device 320, is illustrated. Method 900 is performed by a remote test management device, such as remote test management device 310. The method comprises acquiring 901 one or more test parameters suitable for generating one or more test patterns for a digital logic circuit, acquiring 902 an expected signature corresponding to the test patterns, and transmitting 903 the test parameters to at least one electronic device comprising the digital logic circuit. Method 900 further comprises receiving 904 a test signature from the at least one electronic device, and determining 905 a test result based on a comparison of the expected signature with the received test signature. Method 900 may further comprise additional steps in accordance with what is described hereinbefore, in particular with reference to FIGS. 3 to 6.

Figure 10:
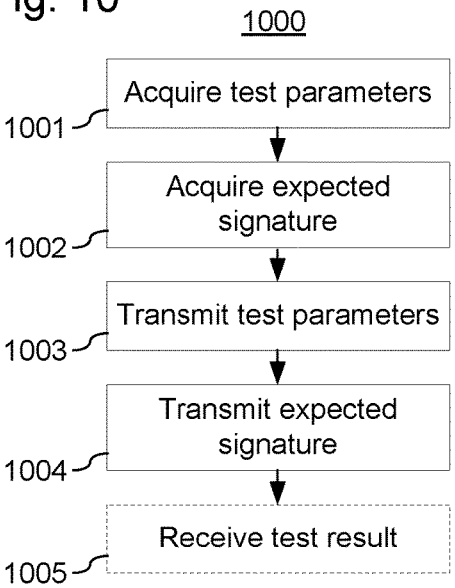
FIG. 10 shows a method of testing performed by the remote test management device, in accordance with another embodiment of the invention.
Figure 11:
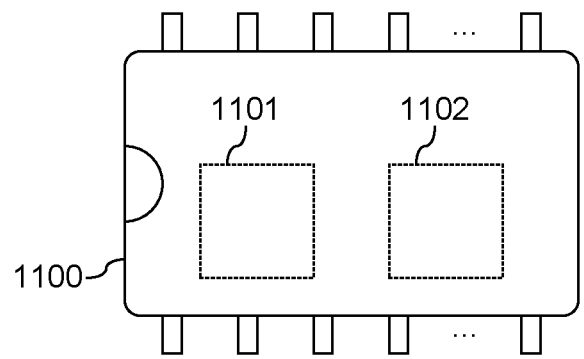
FIG. 11 shows an IC, in accordance with an embodiment of the invention.
Figure 12:
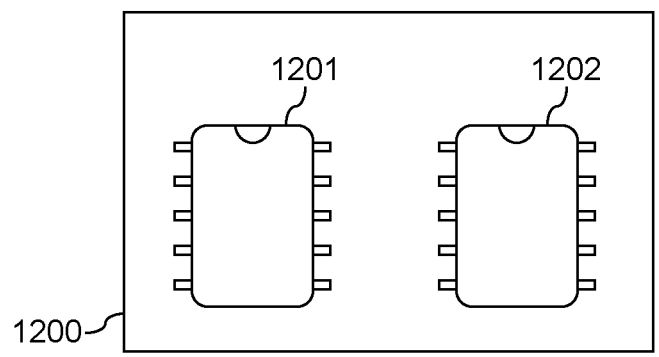
FIG. 12 shows an SoM, in accordance with an embodiment of the invention.
Figure 13:
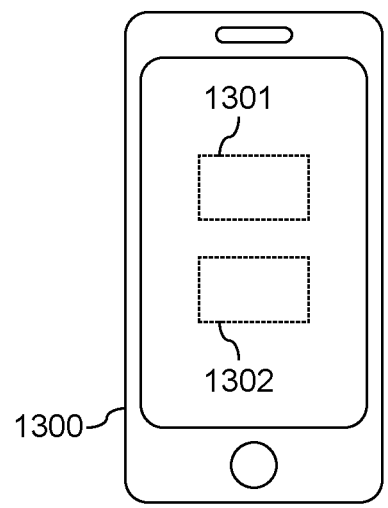
FIG. 13 shows a mobile terminal, in accordance with an embodiment of the invention.

In FIG. 10, an embodiment of another method 1000 of testing a digital logic circuit comprised in an electronic device, such as CUT 101 comprised in electronic device 320, is illustrated. Method 1000 is performed by a remote test management device, such as remote test management device 310. Method 1000 comprises acquiring 1001 one or more test parameters suitable for generating one or more test patterns for a digital logic circuit, acquiring 1002 an expected signature corresponding to the test patterns, transmitting 1003 the test parameters to at least one electronic device comprising the digital logic circuit, and transmitting 1004 the expected signature to the at least one electronic device. Optionally, method 1000 may further comprise receiving 1005 information pertaining to a test result for the test patterns from the at least one electronic device. Method 1000 may further comprise additional steps in accordance with what is described hereinbefore, in particular with reference to FIGS. 3 to 6.

Embodiments of methods 900 or 1000 may be implemented by a computer program 313 comprising computer-executable instructions for causing a device to perform accordingly, when the computer-executable instructions are executed on a processing unit 311 comprised in the device.

The person skilled in the art realizes that the invention by no means is limited to the embodiments described above. On the contrary, many modifications and variations are possible within the scope of the appended claims. It will also be appreciated that embodiments of the invention may be implemented in hardware, i.e., different types of electronic circuitry, software, i.e., processing means executing a suitable computer program, or any combination thereof.

The invention claimed is:

1. An electronic device, comprising:
a digital logic circuit; and
test circuitry configured to:
receive one or more test parameters from a remote test management device;
generate one or more test patterns based on the one or more test parameters;
apply the one or more test patterns to the digital logic circuit;
receive one or more test responses from the digital logic circuit;
compact the one or more test responses into a test signature; and
transmit the test signature to the remote test management device.

2. A mobile terminal comprising the electronic device according to claim 1.

3. The electronic device according to claim 1, further comprising a pseudo-random generator for generating the test patterns based on the test parameters.

4. The electronic device according to claim 1, wherein communication with the remote test management device is encrypted.

5. The electronic device according to claim 1, wherein the test circuit is configured to perform logic self-tests on the digital logic circuit.

6. The electronic device according to claim 1, wherein the one or more test parameters comprise at least one of an initialization value, a number of test patterns to be generated, and one or more sequence numbers of test patterns to be generated.

7. The electronic device according to claim 1, wherein the electronic device is one of an Integrated Circuit, a System-on-Chip, a System-in-Package and a System-on-Module.

8. An electronic device, comprising:
a digital logic circuit; and
a test circuit configured to:
receive one or more test parameters from a remote test management device;
generate one or more test patterns based on the one or more test parameters;
apply the one or more test patterns to the digital logic circuit;
receive one or more test responses from the digital logic circuit;
compact the one or more test responses into a test signature;
receive an expected signature corresponding to the one or more test patterns from the remote test management device; and
determine a test result based on a comparison of the expected signature with the test signature.

9. The electronic device according to claim 8, wherein the test circuit is configured to determine the test result as indicating a fault in the digital logic circuit if the expected signature differs from the test signature.

10. The electronic device according to claim 8, wherein the test circuit is configured to transmit information pertaining to the test result to the remote test management device.

11. The electronic device according to claim 8, further comprising a pseudo-random generator for generating the one or more test patterns based on the one or more test parameters.

12. The electronic device according to claim 8, wherein communication with the remote test management device is encrypted.

13. The electronic device according to claim 8, wherein the test circuit is configured to perform logic self-tests on the digital logic circuit.

14. The electronic device according to claim 8, wherein the one or more test parameters comprise at least one of an initialization value, a number of test patterns to be generated, and one or more sequence numbers of test patterns to be generated.

15. The electronic device according to claim 8, wherein the electronic device is one of an Integrated Circuit, a System-on-Chip, a System-in-Package and a System-on-Module.

16. A cryptographic device comprising the electronic device according to claim 8.

17. A mobile terminal comprising the cryptographic device according to claim 16.

18. A remote test management device, comprising:
interface circuitry configured as a network interface to send and receive communications; and
processing circuitry operatively associated with the interface circuitry and configured to:
acquire one or more test parameters suitable for generating one or more test patterns for a digital logic circuit;
acquire an expected signature corresponding to the one or more test patterns;
transmit the one or more test parameters to at least one electronic device comprising the digital logic circuit;
receive a test signature from the at least one electronic device; and
determine a test result based on a comparison of the expected signature with the test signature.

19. The remote test management device according to claim 18, wherein the processing circuitry is configured to determine the test result as indicating a fault in the digital logic circuit if the expected signature differs from the test signature.

20. The remote test management device according to claim 18, wherein communication with the at least one electronic device is encrypted.

21. The remote test management device according to claim 18, wherein the processing circuitry is configured to acquire the expected signature by computing the expected signature based on the one or more test parameters and a design of the digital logic circuit.

22. The remote test management device according to claim 21, wherein the one or more test parameters comprise at least one of an initialization value, a number of test patterns to be generated, and one or more sequence numbers of test patterns to be generated.

23. A remote test management device, comprising:
   interface circuitry configured as a network interface to send and receive communications; and
   processing circuitry operatively associated with the interface circuitry and configured to:
      acquire one or more test parameters suitable for generating one or more test patterns for a digital logic circuit;
      acquire an expected signature corresponding to the one or more test patterns;
      transmit the one or more test parameters to at least one electronic device comprising the digital logic circuit; and
      transmit the expected signature to the at least one electronic device.

24. The remote test management device according to claim 23, wherein the processing circuitry is configured to receive information pertaining to a test result for the one or more test patterns from the at least one electronic device.

25. The remote test management device according to claim 23, wherein communication with the at least one electronic device is encrypted.

26. The remote test management device according to claim 23, wherein the processing circuitry is configured to acquire the expected signature by computing the expected signature based on the one or more test parameters and a design of the digital logic circuit.

27. The remote test management device according to claim 23, wherein the one or more test parameters comprise at least one of an initialization value, a number of test patterns to be generated, and one or more sequence numbers of test patterns to be generated.

28. A method of testing a digital logic circuit comprised in an electronic device, the method being performed by the electronic device and comprising:
   receiving one or more test parameters from a remote test management device;
   generating one or more test patterns based on the one or more test parameters;
   applying the one or more test patterns to the digital logic circuit;
   receiving one or more test responses from the digital logic circuit;
   compacting the one or more test responses into a test signature; and
   transmitting the test signature to the remote test management device.

29. The method according to claim 28, wherein communication with the remote test management device is encrypted.

30. The method according to claim 28, further comprising performing logic self-tests on the digital logic circuit.

31. The method according to claim 28, wherein the one or more test parameters comprise at least one of an initialization value, a number of test patterns to be generated, and one or more sequence numbers of test patterns to be generated.

32. A method of testing a digital logic circuit comprised in an electronic device, the method being performed by the electronic device and comprising:
   receiving one or more test parameters from a remote test management device;
   generating one or more test patterns based on the one or more test parameters;
   applying the one or more test patterns to the digital logic circuit;
   receiving one or more test responses from the digital logic circuit;
   compacting the one or more test responses into a test signature;
   receiving an expected signature corresponding to the one or more test patterns from the remote test management device; and
   determining a test result based on a comparison of the expected signature with the test signature.

33. The method according to claim 32, wherein the determining of a test result comprises indicating a fault in the digital logic circuit if the expected signature differs from the test signature.

34. The method according to claim 32, further comprising transmitting information pertaining to the test result to the remote test management device.

35. The method according to claim 32, wherein the one or more test patterns are generated based on the one or more test parameters using a pseudo-random generator comprised in the electronic device.

36. The method according to claim 32, wherein communication with the remote test management device is encrypted.

37. The method according to claim 32, further comprising performing logic self-tests on the digital logic circuit.

38. The method according to claim 32, wherein the one or more test parameters comprise at least one of an initialization value, a number of test patterns to be generated, and one or more sequence numbers of test patterns to be generated.

39. A non-transitory computer readable storage medium storing a computer program for testing a digital logic circuit comprised in an electronic device, the computer program comprising computer-executable instructions that, when executed on a processing circuit of the electronic device, causes the electronic device to:
   receive one or more test parameters from a remote test management device;
   generate one or more test patterns based on the test parameters;
   apply the test patterns to the digital logic circuit;
   receive one or more test responses from the digital logic circuit;
   compact the test responses into a test signature; and
   transmit the test signature to the remote test management device.

40. A method of testing a digital logic circuit comprised in an electronic device, the method being performed by a remote test management device, the method comprising:
   acquiring one or more test parameters suitable for generating one or more test patterns for a digital logic circuit;
   acquiring an expected signature corresponding to the one or more test patterns;
   transmitting the one or more test parameters to at least one electronic device comprising the digital logic circuit;
   receiving a test signature from the at least one electronic device; and determining a test result based on a comparison of the expected signature with the test signature.

41. The method according to claim 40, wherein the determining of a test result comprises indicating a fault in the digital logic circuit if the expected signature differs from the test signature.

42. The method according to claim 40, wherein communication with the at least one electronic device is encrypted.

43. The method according to claim 40, wherein the acquiring of the expected signature comprises computing the expected signature based on the one or more test parameters and a design of the digital logic circuit.

44. The method according to claim 40, wherein the one or more test parameters comprise at least one of an initialization value, a number of test patterns to be generated, and one or more sequence numbers of test patterns to be generated.

45. A method of testing a digital logic circuit comprised in an electronic device, the method being performed by a remote test management device, the method comprising:
   acquiring one or more test parameters suitable for generating one or more test patterns for a digital logic circuit;
   acquiring an expected signature corresponding to the one or more test patterns;
   transmitting the one or more test parameters to at least one electronic device comprising the digital logic circuit; and
   transmitting the expected signature to the at least one electronic device.

46. The method according to claim 45, further comprising receiving information pertaining to a test result for the one or more test patterns from the at least one electronic device.

47. The method according to claim 45, wherein communication with the at least one electronic device is encrypted.

48. The method according to claim 45, wherein the acquiring of the expected signature comprises computing the expected signature based on the one or more test parameters and a design of the digital logic circuit.

49. The method according to claim 45, wherein the one or more test parameters comprise at least one of an initialization value, a number of test patterns to be generated, and one or more sequence numbers of test patterns to be generated.

50. A non-transitory computer readable storage medium storing a computer program for testing a digital logic circuit comprised in an electronic device, the computer program comprising computer-executable instructions that, when executed on a processing circuit of a remote test management device, causes the remote test management device to:
   acquire one or more test parameters suitable for generating one or more test patterns for a digital logic circuit;
   acquire an expected signature corresponding to the one or more test patterns;
   transmit the one or more test parameters to at least one electronic device comprising the digital logic circuit;
   receive a test signature from the at least one electronic device; and
   determine a test result based on a comparison of the expected signature with the test signature.

* * * * *

UNITED STATES PATENT AND TRADEMARK OFFICE
CERTIFICATE OF CORRECTION

PATENT NO. : 9,952,278 B2  
APPLICATION NO. : 15/114472  
DATED : April 24, 2018  
INVENTOR(S) : Dubrova et al.

Page 1 of 1

It is certified that error appears in the above-identified patent and that said Letters Patent is hereby corrected as shown below:

On the Title Page

In Item (73), under "Assignee", in Column 1, Line 2, delete "(publ)" and insert -- (publ), Stockholm --, therefor.

Signed and Sealed this
Seventeenth Day of July, 2018

Andrei Iancu
*Director of the United States Patent and Trademark Office*